(12) United States Patent
Wang et al.

(10) Patent No.: US 8,828,814 B2
(45) Date of Patent: Sep. 9, 2014

(54) INTEGRATED SEMICONDUCTOR DEVICE AND FABRICATION METHOD

(71) Applicant: Semiconductor Manufacturing International Corp., Shanghai (CN)

(72) Inventors: Wenbo Wang, Shanghai (CN); Weihai Bu, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 73 days.

(21) Appl. No.: 13/685,729

(22) Filed: Nov. 27, 2012

(65) Prior Publication Data

US 2014/0001540 A1 Jan. 2, 2014

(30) Foreign Application Priority Data

Jul. 2, 2012 (CN) .......................... 2012 1 0226537

(51) Int. Cl.
*H01L 21/338* (2006.01)
(52) U.S. Cl.
USPC ........... 438/183; 438/184; 438/199; 438/230; 257/369

(58) Field of Classification Search
USPC .................. 438/183–184, 199, 230; 257/369, 257/E21.444, E21.453
See application file for complete search history.

(56) References Cited

U.S. PATENT DOCUMENTS

| 6,664,195 | B2 | 12/2003 | Jang et al. | |
| 2010/0019324 | A1* | 1/2010 | Ohara et al. | 257/369 |
| 2013/0005097 | A1* | 1/2013 | Xu et al. | 438/229 |

* cited by examiner

*Primary Examiner* — Theresa T Doan
(74) *Attorney, Agent, or Firm* — Anova Law Group, PLLC

(57) ABSTRACT

A method is provided for fabricating an integrated semiconductor device. The method includes providing a semiconductor substrate having a first active region, a second active region and a plurality of isolation regions; forming a first gate dielectric layer on one surface of the semiconductor substrate; and forming a plurality of substituted gate electrodes, a layer of interlayer dielectric and sources/drains. The method also includes forming a first trench and a second trench; and covering the first gate dielectric layer on the bottom of the first trench. Further, the method includes removing the first dielectric layer on the bottom of the second trench; subsequently forming a second gate dielectric layer on the bottom of the second trench; and forming metal gates by filling the first trench and second trench using a high-K dielectric layer, followed by completely filling the first trench and the second trench using a gate metal layer.

15 Claims, 5 Drawing Sheets

INTEGRATED SEMICONDUCTOR DEVICE AND FABRICATION METHOD

CROSS-REFERENCES TO RELATED APPLICATIONS

This application claims the priority of Chinese patent application No. 201210226537.0, filed on Jul. 2, 2012, the entirety of which is incorporated herein by reference.

FIELD OF THE INVENTION

The present invention generally relates to the field of semiconductor technology and, more particularly, relates to integrated semiconductor devices and techniques for fabricating high-performance integrated semiconductor devices.

BACKGROUND

With the continuously shrinking of the process node of the semiconductor process technology, the conventional metal-oxide-semiconductor (CMOS) devices which use silicon dioxide as a gate dielectric layer and polycrystalline silicon (poly silicon) as a gate electrode layer have faced problems such as the increase of leakage currents and the depletion of gate electrode layers. In order to solve these problems, materials with a high dielectric constant (high-K) are used to substitute silicon dioxide as the gate dielectric layer, and metals are used to substitute the poly silicon as the gate electrode layer (so called a high K metal gate, HKMG).

The problems faced by CMOS such as high leakage current, etc, have been solved by the HKMG process. However, when semiconductor devices made by the HKMG process is integrated with the process for making an entire chip, some problems arise. For example, it is difficult to integrate the HKMG process of core devices with the fabrication process of peripheral in/out devices (I/O devices). Therefore, a fabrication process that can integrate the HKMG process of core devices with the process of I/O device is needed in semiconductor manufacturing industry. The disclosed methods and systems are directed to solve one or more problems set forth above and other problems.

BRIEF SUMMARY OF THE DISCLOSURE

One aspect of the present disclosure includes a method for fabricating an integrated semiconductor device. The method includes providing a semiconductor substrate having a first active region, a second active region and a plurality of isolation regions; forming a first gate dielectric layer on one surface of the semiconductor substrate, and forming a plurality of substituted gate electrodes and a layer of interlayer dielectric layer leveling with the substituted gate electrodes on the surface of the first gate dielectric layer, and sources/drains in the semiconductor substrate. The method also includes removing the substituted gate electrodes to form a first trench and a second trench using the interlayer dielectric layer as a mask, and covering the first gate dielectric layer on the bottom of the first trench using a first barrier layer. Further, the method includes removing the first gate dielectric layer on the bottom of the second trench, and subsequently forming a second gate dielectric layer on the bottom of the second trench. The thickness of the first gate dielectric layer is greater than the thickness of the second gate dielectric layer. And further, the method includes forming metal gates by filling the first trench and second trench using a high-K dielectric layer and followed by completely filling the first trench and the second trench using a metal layer.

Another aspect of the present disclosure includes an integrated semiconductor device. The semiconductor device includes a semiconductor substrate having a plurality of isolation regions, a first active region and a second active region. The first active region is an active region of I/O devices and the second active region is an active region of the HKMG structured devices (core devices). Further, the semiconductor device includes a plurality of sources and drains in both the I/O device region and the core device region. The semiconductor device also includes a first gate dielectric layer on the surface of the first active region, and a second gate dielectric layer on the surface of the second active region. Further, the semiconductor device includes HKMG structured gates consisting of a high-K dielectric layer on the second gate dielectric layer and metal gates on the high-K dielectric layer. And further, the semiconductor device includes a second barrier layer covering the surface of the semiconductor substrate except the portion of the HKMG structured gate region, and an interlayer dielectric layer covering the second barrier layer. The surface of the interlayer dielectric layer is leveled with the top surface of the metal gates.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

With respect to the HKMG process, it can be difficult to integrate the fabrication process of an I/O device region and the HKMG process of a core device region. One reason is that the thickness of the interface layer between the high-K dielectric layer and the underneath substrate of the core device region should be small, but the thickness of gate dielectric layer of the peripheral I/O device region should be large. Only this combination can ensure the dielectric constant of the stacked dielectric layer consisting of the interface layer and the high-K dielectric layer to match the requirement of an integrated semiconductor device. Taking a device with a 1.8V turn-on voltage as an example, the thickness of the gate dielectric layer in the I/O device region is in a range of 2 nm~4 nm; if the turn-on voltage is 2.5V, the thickness of the gate dielectric layer in the I/O device region is up to 5 nm, while the thickness of the interface layer of core devices is only in a range of 0.1 nm~1 nm.

Further, the process for forming the interface layer of the core devices in general may be a thermal oxidation process or a chemical oxidation process. And it is common to form the interface layer after removing the substituted gate (dummy gate). It is also necessary to remove the substituted gate before forming sources and drains. If the substituted gate is removed after forming the sources and gains, the formed devices may fail because it requires a relatively high thermal budget to form the gate dielectric layer of the I/O device region by a thermal oxidation process, and a high thermal budget will deteriorate the original structure of the sources and drains. If a low thermal budget is used, it is unable to form a thick gate dielectric layer of the I/O device region. Therefore, it may be unable to form the gate dielectric layer of the I/O device region and the interface layer of the core device region simultaneously using the thermal oxidation process.

And further, if a chemical oxidation process is used to form the gate dielectric layer of the I/O device region, it may be impossible to obtain a required thickness because of the saturation limitation of the chemical oxidation process, i.e., the substrate cannot be further oxidized after a certain thickness of silicon oxide is formed. Therefore, it may also be unable to form the gate dielectric layer of the I/O device region and the interface layer of the core device region simultaneously using a chemical oxidation process.

Figure 7:
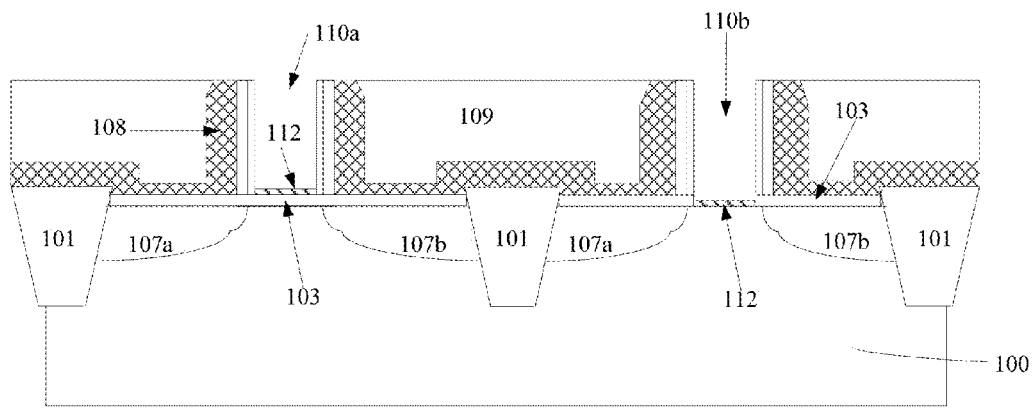
Figure 8:
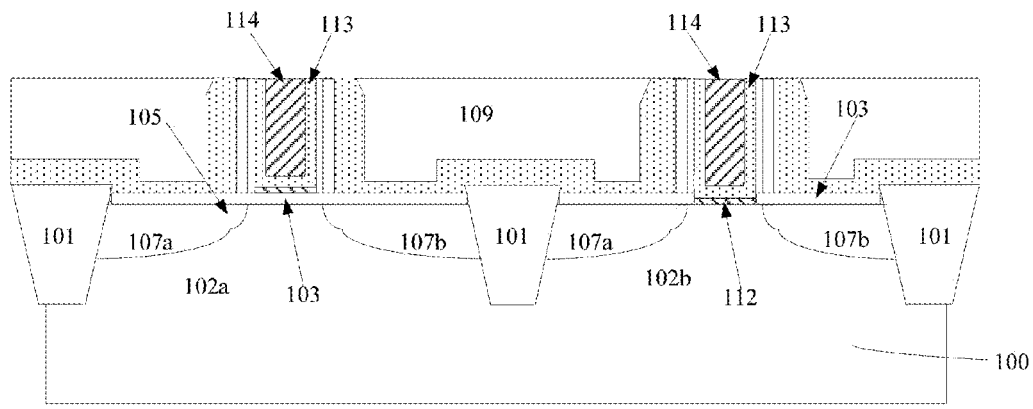
Figure 9:
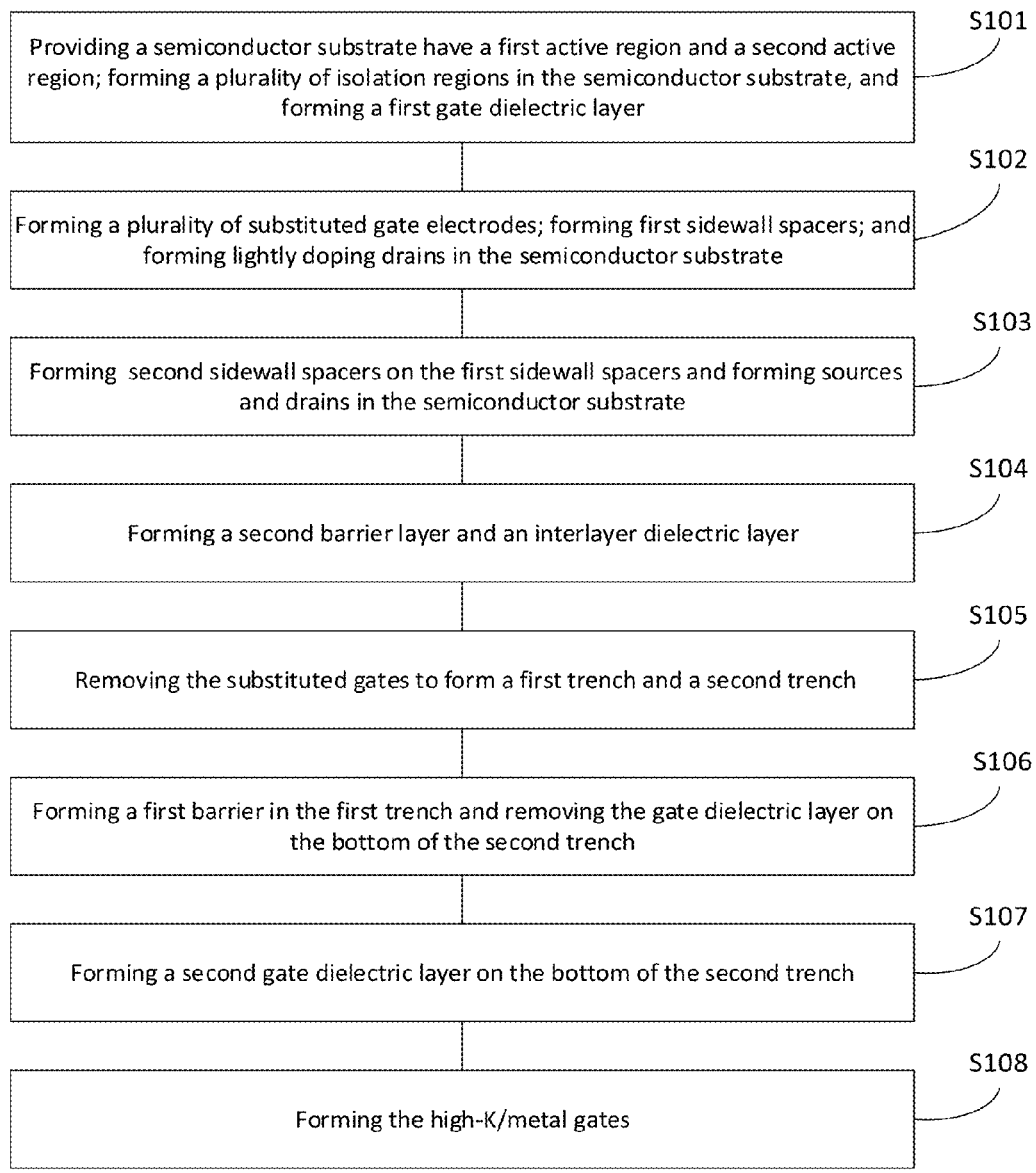
FIG. 9 illustrates an exemplary fabrication process of an integrated semiconductor device consistent with the disclosed embodiments.

Based on the above analysis, the present disclosure provides an integrated semiconductor and a fabrication process. FIG. 9 illustrates an exemplary fabrication process of an integrated semiconductor device, and FIGS. 1-8 illustrate the semiconductor structures corresponding to certain stages of the exemplary fabrication process consistent with the disclosed embodiments.

Figure 2:
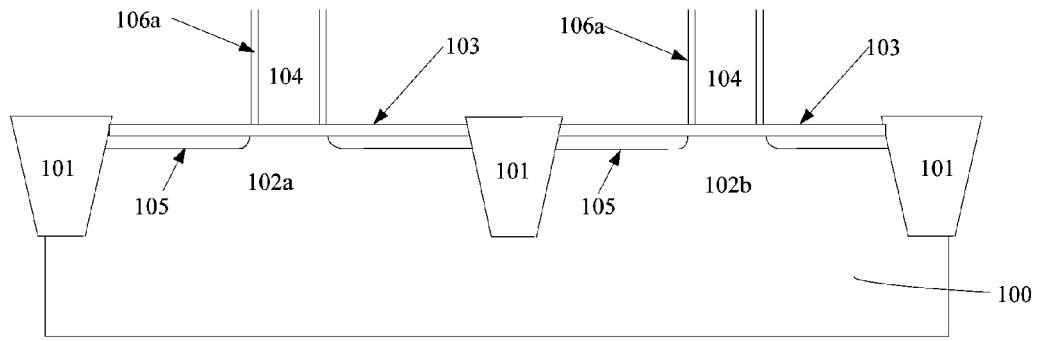

As shown in FIG. 9, at the beginning of the fabrication process, a semiconductor substrate is provided (S101). FIG. 2 shows a corresponding semiconductor device.

As show in FIG. 2, a semiconductor substrate 100 is provided. The semiconductor substrate 100 may include any appropriate type of semiconductor material, such as single crystal silicon, poly silicon, amorphous silicon or silicon germanium. The semiconductor substrate 100 may also be made of carborundum, indium antimonide, lead telluride, indium arsenide, indium phosphide, gallium arsenide or gallium antimonide, alloy semiconductor or a combination thereof. Further, the semiconductor substrate 100 may be made of any other appropriate material, such as epitaxially grown materials and/or silicon on insulator (SOI). In one embodiment, the semiconductor substrate 100 is silicon. The semiconductor substrate 100 may also provide a base for subsequent processes and structures.

A plurality of isolation regions 101 and a plurality of active regions may be formed inside one surface of the semiconductor substrate 100. The term inside one surface of the semiconductor substrate 100 may refer to the region underneath the surface of the semiconductor substrate 100, which belongs to the semiconductor substrate 100. The isolation regions 101 may be made of any appropriate type of material, such as silicon nitride, silicon oxynitride, silicon oxycarbide, amorphous carbon or carbon silicon oxynitride, etc.

The isolation regions 101 may be a shallow trench insolation (STI) region formed by a high density plasma chemical vapor deposition process (HDPCVD), and/or a local oxidation of silicon (LOCOS) isolation region formed by a thermal oxidation process. The isolation regions 101 may also be formed by other appropriate processes, such as a flowable chemical vapor deposition process (FCVD), etc.

Figure 1:
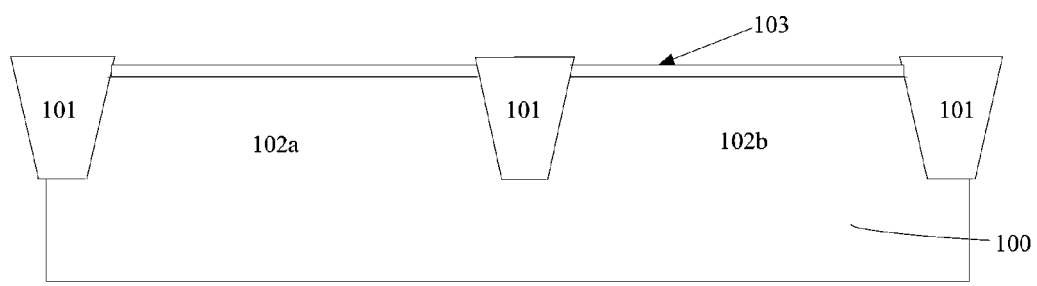
FIGS. 1-8 illustrate semiconductor structures corresponding to certain stages of an exemplary fabrication process of an integrated semiconductor device consistent with the disclosed embodiments.

The active regions may belong to different types of devices and/or same type of devices. As shown in FIG. 1, in one embodiment, the active region belongs to different types of devices, which may refer as a first active region 102a and a second active region 102b, i.e., the first active region 102a and the second active region 102b may have different gate dielectric thicknesses. And the first active region 102a may be an active region of I/O devices, and the second active region 102b may be an active region of core devices formed by an HKMG process which may refer as HKMG structured core devices.

The doping type of the first active region 102a and the second active region 102b may be same or may be different. When a p-type doping process is used, the dopant may be any appropriate type trivalent ion, such as boron, etc. When an n-type doping process is used, the dopant may be any appropriate pentavalence ion, such as phosphorous and/or arsenic, etc.

Further, after forming the isolation regions 101, the first active region 102a and the second active region 102b, a first gate dielectric layer 103 may be formed on the surface of the semiconductor substrate 100, as shown in FIG. 1. The term on the surface of the semiconductor substrate 100 may refer to the region over the semiconductor substrate 100, which does not belong to the semiconductor substrate 100. The first gate layer 103 may cover the whole first active region 102a and the whole second active region 102b.

The first gate dielectric layer 103 may be made of any appropriate type of isolation material, such as silicon oxide, silicon nitride, silicon oxynitride, or a combination thereof. In one embodiment, the first gate dielectric layer 103 is silicon oxide, thus the first gate dielectric layer 103 may be referred as a gate oxide layer.

Various fabrication processes may be used to form the first gate dielectric layer 103, such as a thermal oxidation process, a chemical vapor deposition process (CVD), or a physical vapor deposition process (PVD), etc. In one embodiment, the first gate dielectric layer 103 is formed by the thermal oxidation process.

The first gate dielectric layer 103 may be a gate dielectric layer of the I/O devices, thus the first gate dielectric layer 103 may be relatively thick. A thickness of the first gate dielectric layer 103 may be in a range of approximately 1 nm~6 nm, the thickness of 1 nm and 6 nm may be both included. For example, the thickness of the gate dielectric layer 103 of an I/O device with a turn-on voltage of 1.8V may be in a range of approximately 1 nm~4 nm. The thickness of the first gate dielectric layer 103 of an I/O device with a turn-on voltage of 2.5V may be approximately 5 nm. In certain embodiments, the thickness of the first gate dielectric layer 103 may be approximately 4.5 nm, 5.5 nm, and/or up to 6 nm.

In one embodiment, the first gate dielectric layer 103 may be formed by a thermal oxidation process. Because the thermal oxidation process may form a relatively thick oxide layer, the thickness of the formed oxide layer may match the thickness requirement of the I/O devices. Further, because the first gate dielectric layer 103 may be formed before forming later-formed source and drain regions, it may be unnecessary to consider subsequent effects of the high thermal budget for forming the relatively thick first gate dielectric layer 103.

Returning to FIG. 9, after forming the first gate dielectric layer 103, substituted gate electrode layers may be formed on the surface of the first gate dielectric layer 103 to form substituted gate structures (S102). FIG. 2 shows a corresponding semiconductor structure.

As shown in FIG. 2, substituted gate layers 104 is formed onto the first gate dielectric layer 103. In one embodiment, the substituted gate layers 104 may be formed over both the first active region 102a and the second active region 102b. A portion of the first gate dielectric layer 103 underneath the substituted gate electrode layers 104 may be used as a substituted gate dielectric layer of the substituted gate structures.

The fabrication process of the substituted gate electrode layers 104 may include depositing a poly silicon layer on the first gate dielectric layer 103 and spin coating a layer of photoresist onto the poly silicon layer. An anti-reflection layer may be formed between the photoresist layer and the poly silicon layer to reduce the unnecessary reflection to increase the exposure resolution. The anti-reflection layer may be made of appropriate organic material or inorganic material. The fabrication process of the substituted gate electrode layers 104 also includes exposing the photoresist layer using a photo mask with patterns of the substituted gate electrode layers 104, the photoresist layer with the patterns of the substituted gate electrode layers 104 may be obtained after a photoresist development process. Further, the fabrication process of the substituted gate electrode layers 104 may include removing the portion of the poly silicon layer without the photoresist layer using an etching process to form the substituted gate electrode layers 104. The etching process may be a dry etching process, such as a plasma etching process or an ion beam etching process, etc. The etching process may be also a wet etching process.

Various processes may be used to form the poly silicon layer, such as a chemical vapor deposition process (CVD) or a physical vapor deposition (PVD) process. In one embodiment, the poly silicon layer is formed using the CVD process. The thickness of the poly silicon layer may determine the height of the substituted gate electrode layer 104, which may be also the height of subsequently formed metal gates.

Returning to FIG. 9, after forming the substituted gate electrode layers 104, lightly doped drains (LDDs) may be formed in the semiconductor substrate 100 (S102). FIG. 2 shows a corresponding semiconductor structure.

As shown in FIG. 2, LDDs 105 is formed inside the substrate 100. Various processes may be used to form the LDDs 105. In one embodiment, a double sidewall spacer process may be used to form the LDDs 105. The double sidewall spacer process for forming the LDDs 105 includes forming a thin silicon oxide layer of a subsequently formed first sidewall spacer on the surface of the first gate dielectric layer 103 and around the substituted gate electrode layers 104(not shown), and forming a layer of silicon nitride of the subsequently formed first sidewall spacer on the thin silicon oxide layer (not shown). Various fabrication processes may be used to deposit the oxide layer and the silicon nitride layer, such as a CVD process or a PVD process, etc.

The doubled sidewall spacer process for forming the LDDs 105 also includes performing an etch back process to the silicon nitride layer to form a first sidewall spacer 106a as shown in FIG. 2. After etching the silicon nitride layer of the first sidewall spacer 106a, the silicon oxide layer of the first sidewall spacer 106a may be still on the surface of the semiconductor substrate 100. Namely, the silicon oxide layer of the first sidewall spacer 106a and a portion of the silicon nitride layer of the first sidewall spacer 106a may still on sidewalls of the substituted gate electrode layers 104, and the silicon oxide layer of the first sidewall spacer 106a may be still on the top of the substituted gate electrode layer 104 (not shown). In other words, the first sidewall spacer 106a may be a doubly stacked layer consisting of the silicon oxide layer and a portion of the silicon nitride layer on the sidewalls of the substituted gate electrode layers 104. Various etching processes may be used as the etch back process, such as a plasma etching process, an ion beam etching process or a wet chemical etching process, etc.

Further, the double sidewall spacer process for forming the LDDs 105 includes performing lightly doping ion implantation process on the semiconductor substrate 100 to form the LDDs 105. Certain type of ion may be used to dope the semiconductor substrate 100. In one embodiment, when a p-type ion implantation process is used to form a p-type metal-oxide-semiconductor (PMOS) transistor region, the p-type ion may be boron ion, and/or other appropriate ions; when an n-type ion implantation process is used to form an n-type MOS (NMOS) transistor region, the n-type ion may be phosphorus ion or arsenic ion, etc.

And further, the double sidewall spacer process for forming the LDDs 105 includes annealing the semiconductor substrate 100 after the ion implantation process. The annealing process may cause implanted ions of the LDDs 105 to diffuse uniformly along both vertical and lateral directions. In certain embodiment, the annealing process may be performed simultaneously with another annealing process of later-formed sources and drains.

Figure 3:
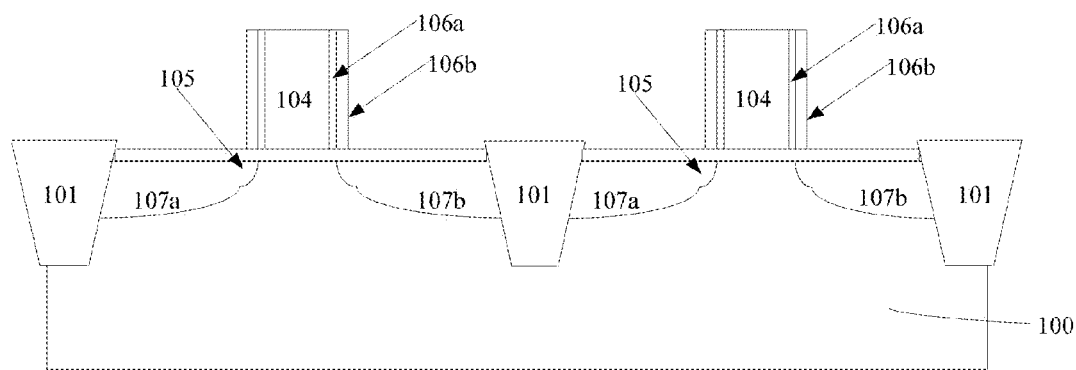

Returning to the FIG. 9, after forming the LDDs 105, a second sidewall spacer may be formed on the semiconductor substrate 100 (S 103). FIG. 3 shows a corresponding semiconductor structure.

As shown in FIG. 3, a second sidewall spacer 106b is formed on the first sidewall spacer 106a. The fabrication process for forming the second sidewall spacer 106b includes forming a second silicon oxide layer of the second sidewall spacer 106b on the semiconductor substrate 100 and around the first sidewall spacer 106a, and forming a second silicon nitride layer on the second silicon oxide layer (not shown). Further, the fabrication process for forming the second sidewall spacer 106b includes performing an etch back process on the silicon nitride layer. The silicon oxide layer and a portion of the silicon nitride layer on the first sidewall spacer 106a may form the second sidewall spacer 106b after the etch back process. Namely, the second sidewall spacer 106b may be a doubly stacked layer consisting of the silicon oxide layer and the silicon nitride layer.

Various deposition processes may be used to form the oxide layer and the silicon nitride layer of the second sidewall spacer 106b, such as a CVD process, a PVD process, or a thermal oxidation process, etc.

Various etching processes may be used as the etch back process, such as a plasma etching process, an ion beam etching process, or a wet etching process, etc.

For illustrative purposes, the term sidewall spacers may refer to both the first sidewall spacer 106a and the second sidewall spacer 106b. In one embodiment, the sequential structure of the sidewall spacers from inside to outside is the silicon oxide layer the first sidewall spacer 106a-the silicon nitride layer of the first sidewalls spacer 106a-the silicon oxide layer of the second sidewall spacers 106b-the silicon nitride layer of the second sidewall spacer 106b. In other embodiments, the sidewall spacer may be formed by a single sidewall spacer process, i.e., the sidewall spacer may be made of only one of silicon oxide and silicon nitride. After forming the sidewall spacers, the first gate dielectric layer 103 may remain.

Returning to FIG. 9, after forming the sidewall spacers, a heavily doping implantation may be performed on the semiconductor substrate 100 to form sources and drains using the substituted gate electrode 104 and the sidewall spacers as a mask (S 103). FIG. 3 shows the corresponding semiconductor structure.

As shown in FIG. 3, sources 107a and drains 107b are formed in the semiconductor substrate 100. The depth of the sources 107a and the drains 107b is greater than the depth of the LDDs 105. Various types of ions may be used in the ion implantation process. In one embodiment, when a p-type ion implantation process is used to form a PMOS transistor region, the p-type ion may be boron ion, and/or other appropriate ions; when an n-type ion implantation process is used to form an NMOS transistor region, the n-type ion may be phosphorus ion or arsenic ion, etc.

Further, after the heavily doping implantation process, a thermal annealing process may be performed to cause the implanted ions to diffuse uniformly along both vertical direction and lateral directions.

Figure 4:
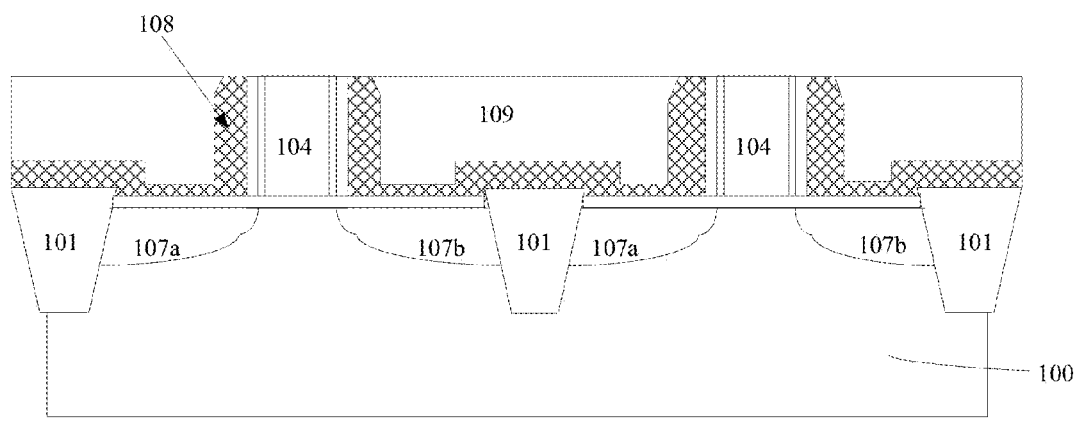

Returning to FIG. 9, after forming the sources 106a and the drains 106b, a second barrier layer may be formed on the surface of the first dielectric layer 103 (S 104). FIG. 4 shows a corresponding semiconductor structures.

As shown in FIG. 4, a second barrier layer 108 is formed on the surface of the first dielectric layer. The second barrier layer may be formed by a CVD process or a PVD process. The second barrier layer 108 may be made of any appropriate isolation material, such as silicon nitride or silicon oxide, etc.

Further, an interlayer dielectric layer 109 may be formed on the second barrier layer 108 by a CVD process or a PVD process (S104). A corresponding semiconductor structure is shown in FIG. 4. The interlayer dielectric layer 109 herein may refer to a zero order interlayer dielectric layer, ILD0.

The interlayer dielectric layer 109 may be made of any appropriate isolation material, such as silicon oxide or silicon nitride, etc. After forming the second barrier layer 108 and the interlayer dielectric layer 109, a chemical mechanical polishing process (CMP) may be used to polish a top portion of the second barrier layer 108 and the interlayer dielectric layer 109 until the top surface of the substituted gate electrode layers 104 is exposed. After the CMP process, the portion of the silicon oxide of the first sidewall spacer 106a and the portion of the silicon oxide of the second sidewalls spacer 106b formed on the top surface of the substituted gate electrode layer during the fabrication process of the sidewall spacers may be removed, the top surface of the interlayer dielectric layer 109 is leveled with the top surface of the substituted gate electrode layers 104.

The interlayer dielectric layer 109 may be used to reduce the excessive damage of subsequent CMP processes on the surface of the substituted gate electrode layer 104, and may ensure the accuracy of the height of the substituted gate electrode layers 104. Further, the interlayer dielectric layer 109 may be also used as a stress relief layer for subsequently formed vias and metal interconnections to protect the semiconductor substrate 100. Specifically, during the CMP process of the second barrier layer 108 and the interlayer dielectric layer 109, a relatively high polishing speed may be used to polish the interlayer dielectric layer 109; when the polished surface reaches the surface of the second barrier layer 108, a relatively low speed may be used to polish the second barrier layer 108 until the top surface of the substituted gate electrode layer 104 is exposed.

In order to ensure the substituted gate electrode layers 104 to be completely exposed, the second barrier layer 108 may be over polished. Because the polishing rate of the second barrier layer 108 may be relatively low, the damage of the over polishing may be less severe.

Various types of polishing suspensions may be used for the CMP process, such as a silicon oxide polishing suspension or a cerium oxide polishing suspension. The polishing suspension may have a selective planarization rate, i.e., the planarization rate ratio of the silicon oxide and silicon nitride is greater than 1. The selective planarization rate may ensure that a portion of the silicon nitride barrier layer 108 and a portion of the silicon oxide of ILD0 layer over the substituted gate electrode layers 104 may be simultaneously polished away. The particle size of the silicon oxide polishing suspension may be in a range of approximately 1 nm~10 nm. The advantage of the silicon oxide suspension may include good particle dispersion, active chemical reaction and easy after-cleaning. The particle size of the cerium oxide polishing suspension may be in a range of approximately 10 nm~20 nm. The advantage of the cerium oxide polishing suspension may include high polishing rate, high material removing rate and less damage to the polished surface.

Because the interlayer dielectric layer 109 and the substituted gate electrode layers 104 are made of different materials, in certain embodiments, the second barrier layer 108 may be unnecessary. When the second barrier layer is not used, certain parameters of the CMP process may be controlled to reduce the damage. For example, according to stages of the CMP process, different polishing speed may be used.

At the beginning of the CMP process, a relatively high speed may be used to polish the ILD0 109. After certain amount of time, the polishing speed may be reduced. That is, a slow polishing speed may be used to polish the residue ILD0 109 on the surface of the substituted gate electrode layers 104. Similarly, the ILD0 109 may be over polished to completely expose the substituted gate electrode layers 104. Because the polishing speed may be relatively low, the damage of the over polishing to the substituted gate electrode layers 104 may be less severe. A polishing suspension with a selective planarization rate ratio of poly silicon and the ILD0 layer greater than 1 may also be used. Other appropriate polishing suspensions may also be used.

Figure 5:
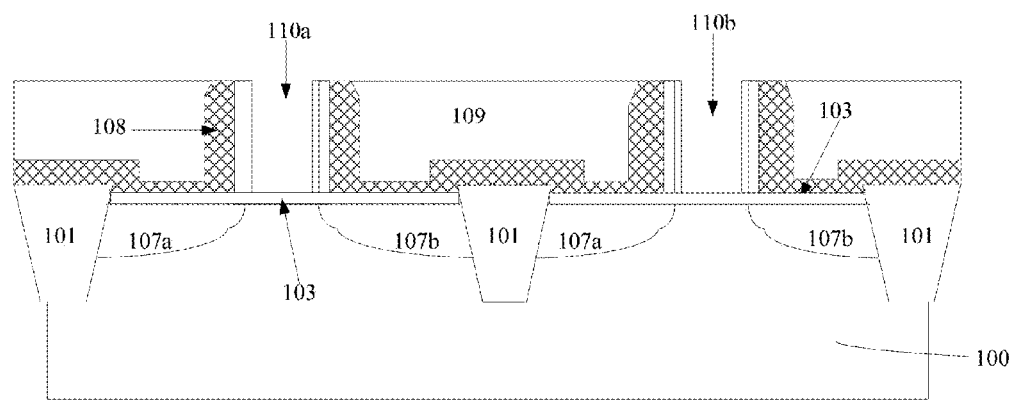

Returning to FIG. 9, after the CMP process, a plurality of trenches may be formed (S105). FIG. 5 shows a corresponding semiconductor structure.

As shown in FIG. 5, a plurality of trenches is formed by removing the substituted gate electrode layers 104 using the interlayer dielectric layer 109 as a mask. A trench over the first active region 102a may be a first trench 110a, and a trench over the second active region 102b may be a second trench 110b. Only the substituted gate electrode layers 104 may be removed in this process, the first dielectric layer 103 underneath the substituted gate electrode layers 104 may remain.

The substituted gate electrode layers 104 may be removed by any appropriate method. For example, the substituted gate electrode layers 104 may be removed by a wet etching process, a plasma etching process or an ion beam etching process, etc. In one embodiment, the substituted gate electrode layers 104 are removed by a wet etching process. The etching liquid of the wet etching process may be tetramethylammonium hydroxide or other appropriate chemicals; the concentration of tetramethylammonium hydroxide (weight percentage) may be in a range of approximately 2%~4%; the etching temperature may be in a range of approximately 50° C.~90° C.; the etching rate may be in a range of approximately 100 Å~3000 Å/min. The ratio of the etching rate of poly silicon to the etching rate of silicon oxide may be greater than 100:1; therefore the substituted gate electrode layers 104 may be completely removed with a less severe damage on the first dielectric layer 103. The advantage of the wet chemical etching process may include easy handling, low requirement of instruments and easy to achieve mass production.

In other embodiment, the substituted gate electrode layers 104 may be removed by a dry etching process. For example, the substituted gate electrode layers 104 may be removed by a reactive ion etching process (RIE). A bromide based gases such as $Br_2$ or HBr, chlorine, helium or a mixture of helium and oxygen may be used for the RIE process to reduce the damage to the first gate dielectric layer 103. The advantage of the RIE process may include anisotropic etching, high etching rate, high selective etching rate ratio of poly silicon and silicon oxide and high selective etch rate ratio of poly silicon and silicon nitride. The selective etching rate ratio may be even greater than 100:1. When the bromide based etching gas is used, the gas flow may be in a range of approximately 50 sccm~1000 sccm, the etching bias voltage may be in a range of approximately 0V~250V; the etching chamber pressure may be in a range of approximately 1 mTorr~100 mTorr; the etching temperature may be in a range of approximately 20° C.~100° C.; and the etching time may be in a range of approximately 1 s~100 s.

Figure 6:
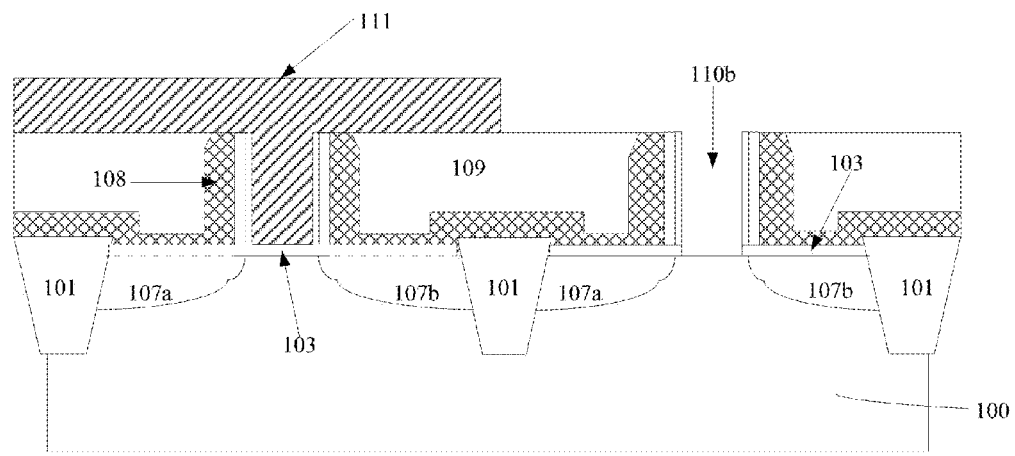

Returning to FIG. 9, after forming the first trench 110a and the second trench 110b by removing the substituted gate electrode layers 104, a first barrier layer may be formed to cover the first trench and the first gate dielectric layer 103 on the bottom of the second trench 110b may be removed (S106). FIG. 6 shows a corresponding semiconductor structure.

As shown in FIG. 6, a first barrier layer 111 is formed on the interlayer dielectric layer 109 to at least cover the bottom of the first trench 110a. That is, the first trench 110a may be completely filled by the first barrier 111. Further, because the critical dimension (CD) of the second trench 110b may be relatively small, the first barrier layer 111 may cover the surrounding ILD0 layer 109 of the first trench 110a, and the trench 110b may need to be exposed to reduce the process difficulty.

The first barrier layer 111 may be made of any appropriate material, such as silicon oxide, silicon nitride, and photo resist etc. In one embodiment, the first barrier layer 111 is a layer of photoresist to reduce the fabrication steps and cost. When the photoresist layer is used as the first barrier layer 111, the first barrier layer 111 may be formed by a spin coating process, followed by exposing the photoresist layer using a photo mask having patterns of the first barrier layer 111, and developing.

After forming the first barrier layer 111, the first gate dielectric layer 103 on the bottom of the second trench 110b may be removed by an appropriate process using the first barrier layer 111 as an etching mask as shown in FIG. 6. Various etching processes may be used to remove the first gate dielectric layer 103 on the bottom of the second trench 110b, such as a plasma etching process, an ion beam etching process or a wet chemical etching process. In one embodiment, the first gate dielectric layer 103 on the bottom of the second trench 110b is removed by a wet etching process. The etching liquid may be a mixture solution of HF and HCl, a mixture solution of HF and $NH_3$, a HF solution, or other combination thereof. In one embodiment, the etching liquid is a thin HF solution with a HF:$H_2O$ mass ratio of approximately 50:1.

In other embodiments, the first gate dielectric layer 103 on the bottom of the second trench 110b may be removed a dry etching process. The etching gas may be a fluoride-carbon compound or a fluoride-hydrocarbon compound, and the carrier gas may be any one of argon and helium. When argon is used as a carrier gas, the ratio of argon to the etching gas may be approximately 1, and a desired etching quality may be obtained. When helium is used as a carrier gas, the ratio of helium to the etching gas may be approximately 2:1, and a desired quality may be obtained. In one embodiment, the carrier gas is argon. The flow rate of the etching gas may be in a range of approximately 10 sccm~1000 sccm; the flow rate of the carrier gas may be in a range of approximately 5 sccm~100 sccm; the etching bias may be in a range of approximately 0V~250V; the pressure of the etching chamber may be in a range of approximately 1 mTorr~100 mTorr; the etching temperature may be in a range of approximately 20° C.~100° C.; and the etching time may be in a range of approximately 1 s~100 s.

When a dry etching process is used to remove the first gate dielectric layer 103 on the bottom of the second trench 110b, the selective etching rate ratio of silicon oxide and photoresist may be greater than 1 to reduce excessive damage on the first barrier layer 111 during the etching process to completely remove the first gate dielectric layer 103 on the bottom of the second trench 110b. Further, the existence of the second barrier layer 108 may prevent the etching particles from damaging the top corners the second trench 106b, thus may ensure the quality of later-formed high-K dielectric layer and metal gates.

Returning to FIG. 9, after removing the first gate dielectric layer 103 on the bottom of the second trench 110b, the first barrier layer 111 may be removed and form a second gate dielectric layer (S107). FIG. 7 shows a corresponding semiconductor structure.

As shown in FIG. 7, the first barrier layer 111 is removed and a second gate dielectric layer 112 is formed. Various methods may be used to remove the first barrier layer 111. For example, when photoresist is used as the first barrier layer 111, a plasma etching process may be used to remove the first barrier layer 111. Further, a chemical cleaning process may be performed to clean residue photoresist, impurity particles and native oxide layer on the bottom of the second trench 110b. The plasma cleaning process may ensure the quality of later-formed second gate dielectric layer. The chemical cleaning process may include a plasma ashing process to remove the residue photoresist, followed by rinsing the surface the semiconductor substrate 100 using super-pure water or deionized (DI) water, and further soaking the semiconductor substrate 100 into isopropyl alcohol. Other methods may also be used to completely remove the first barrier layer 111.

Further, after removing the first barrier layer 111, a second gate dielectric layer 112 may be formed on the bottom of the first trench 110a and the bottom of the second trench 110b as shown in FIG. 7. The thickness of the second gate dielectric layer 112 is smaller than the thickness of the first gate dielectric layer 103. In one embodiment, the second gate dielectric layer 112 may be the interface layer of the later-formed high-K dielectric layer and the semiconductor substrate 100 of a HKMG structured core device. The second gate dielectric layer 112 may made of any appropriate material, such as silicon oxide, silicon nitride, silicon oxynitride, or a combination thereof. The thickness of the second gate dielectric layer 112 may be in a range of approximately 0.1 nm~2 nm. In certain embodiments, the thickness of the second gate dielectric layer 112 may be in a range of approximately 0.1 nm~1 nm. In certain other embodiments, the thickness of the second gate dielectric layer 112 may be in a range of approximately 0.5 nm~1.5 nm.

The existence of the second gate dielectric layer 112 may help to preserve an interface state characteristic and form a desired electrical characteristic interface. Further, the second gate dielectric layer 112 may closely connect with channels of a transistor. Therefore, the thickness and quality of the second gate dielectric layer 112 may affect the device performance.

In one embodiment, the second gate dielectric layer 112 may be formed by an atomic layer deposition process (ALD). Because a high temperature process, i.e., higher than 500° C., may affect the quality of the sources 107a and drains 107b, the reaction temperature of the ALD process may be not over 500° C.

Because the first gate dielectric layer 103 on the bottom of the first trench 110a may be damaged during the process to remove the substituted gate electrode layers 104, in certain embodiments, the second gate dielectric layer 112 may be formed after removing the first barrier layer 111. The second gate dielectric layer 112 may be formed on the surface of the first gate dielectric layer 103 on the bottom of the first trench 110a simultaneously when the second gate dielectric layer 112 is formed on the bottom of the second trench 110b. The second gate dielectric layer 112 on the first dielectric layer 103 on the bottom of the first trench 110a may compensate the minor damage caused by removing the substituted gate electrode layers 104 using the etching process. Therefore, it may further preserve the thickness and quality of the first gate dielectric layer 103 on the bottom of the first trench 110a. If the damage caused by removing the substituted gate electrode layer 104 using the etching process is less severe, the device performance may be not affected.

In another embodiment, the second gate dielectric layer 112 is made of silicon oxide, and may be formed by a chemical oxidation process. The chemical oxidation process for forming the second gate dielectric layer 112 includes soaking the semiconductor substrate 100 into an oxidative liquid to oxide the surface of the semiconductor substrate 100 on the bottom of the trench 110b. The oxidative liquid may include any one of nitric acid solution, perchloric acid solution, sulfuric acid solution, hydrogen peroxide, a mixture solution of hydrochloric acid and hydrogen peroxide, ozone water solution, a mixture solution of ammonia and hydrogen peroxide, a mixture solution of nitric acid and sulfuric acid, aqua regia and boiling water, etc.

When the ozone water solution is used as the oxidation liquid, the chemical oxidation process for forming the second gate dielectric layer 112 may include soaking the semiconductor substrate 100 into a water solution of ozone in a water bath to form a thin oxide layer, followed by drying the semiconductor substrate 100 using isopropyl alcohol or a spinning dry process. The ozone concentration of the chemical oxidation process may be in a range of approximately 1%~7%; the temperature of the water bath may be lower than 200° C. For example, the temperature of the water bath may be in a range of approximately 50° C.~180° C.

Because the second gate dielectric layer 112 may be formed on the bottom of the second trench 110b, the chemical oxidation process may ensure the bottom of 110b to completely and uniformly contact with the oxidative liquid, therefore ensure that the silicon oxide layer may be formed on any corner of the bottom of 110b, and the thickness of the second gate dielectric layer 112 may be uniform too. Further, the chemical oxidation process itself may have a saturation limitation, thus it may ensure the formed silicon oxide layer is thin enough to match the thickness requirement of the second dielectric layer 112. And further, the temperature of the chemical oxidation process for forming the second gate dielectric layer 112 may be very low, for example, it may be lower than 200° C., thus the chemical oxidation process may have insignificant effect on the structure and quality of the sources 107a and the drains 107b in the semiconductor substrate 100. Therefore, the chemical oxidation process may be desired to form the second gate dielectric layer 112 when high temperature is a concern.

When the chemical oxidation method is used to form the second gate dielectric layer 112, the first dielectric layer 103 may prevent the semiconductor substrate 110 form further oxidizing that is the second gate dielectric layer 112 on the first dielectric 103 on the bottom of the first trench 110a as shown if FIG. 7 may not exist. The first gate dielectric layer 103 on the bottom of the first trench 110a may be a single layer.

In certain embodiments, the first barrier layer 111 may be kept until subsequently forming a high-K dielectric layer. The second dielectric layer 112 on the first gate dielectric layer 103 on the bottom of the first trench 110a as shown in FIG. 7 may not exist because the first trench 110a is covered by the first barrier layer 111. Other processes may also be used to form the second gate dielectric layer 112.

Returning to FIG. 9, after forming the second gate dielectric layer 112, high K/metal gates may be formed inside the first trench 110a and the second trench 110b (S108). FIG. 8 shows a corresponding semiconductor structure.

As shown in FIG. 8, high-K dielectric layers 113 and metal gates 114 are formed inside the first trench 119a and the second trench 110b to form high-K/metal-gates (HKMG). The HKMG process includes: forming a high-k dielectric layer 113 on sidewalls and bottoms of the first trench 110a and the second trench 110b; forming a gate metal layer on the interlayer dielectric layer 109; and polishing the gate metal layer until the interlayer dielectric layer 109 is exposed to form metal gated 114.

Various processes may be used to form the high-K dielectric layer 113, such as a CVD process, a PVD process, or a flowable CVD (FCVD), etc. The thickness of the high-K dielectric layer 113 may be in a range approximately 10 Å~30 Å. The high-K dielectric layer 113 may be made of any one of hafnium dioxide, hafnium silicate, lanthanum oxide, lanthanum aluminum oxide, zirconium oxide, zirconium silicate, tantalum oxide, titanium oxide, barium strontium titanate, barium titanate, strontium titanate, yttrium oxide, lead scandium tantalite and lead zinc niobate, etc.

Various processes may be used to form the gate metal layer, such a CVD process or a PVD process, etc. The gate metal layer herein may be a single coating or a multiple-stacked structure.

When the gate metal layer is a single coating, the gate metal layer may be made of any one of aluminum, copper, silver, gold, platinum, nickel, titanium, thallium, tantalum, tungsten, tungsten silicide, titanium tungsten alloy, titanium nitride, thallium nitride, thallium carbide, nickel platinum ally and thallium nitrate silicate, etc.

When the gate metal layer is a multiple-stacked layer, the gate metal layer may include a work function layer on the gate dielectric layer and a second gate metal layer on the work function layer. The gate dielectric layer of the I/O device region may include the first gate dielectric layer 103 and the second gate dielectric layer 112, with a significantly large thickness. The gate dielectric layer of the core device region may include only the second gate dielectric layer 112, with a significantly small thickness.

In one embodiment, the work function layer may be made of any one of titanium, thallium, titanium aluminum alloy and thallium nitride, etc. The second gate metal layer may be made of any one of aluminum, copper, silver, gold, platinum, nickel, titanium, thallium, tantalum, tungsten, tungsten silicide, titanium tungsten alloy, titanium nitride, thallium nitride, thallium carbide, nickel platinum ally and thallium nitrate silicate, etc.

After forming the metal gate electrodes 114, further CMOS processes, such as a metal interconnection, may be performed. The details for subsequent processes are omitted.

In the disclosed embodiments, the thicker first gate dielectric layer 103 may be formed firstly, followed by forming sources 107a and drains 107b, thus the high thermal budget for forming the first gate dielectric layer 103 may have no effect on the subsequently formed sources 107a and drains 107b. Therefore the thickness of the first gate dielectric layer 103 may match the requirement of the I/O devices without affecting the quality of the sources 107a and the drains 107b.

Further, the first gate dielectric layer 103 may be formed by a thermal oxidation process, a CVD process or a PVD process without using a chemical oxidation process, thus a desired thickness of the first gate layer 103 may be obtained. In addition, the relatively thin second dielectric layer 112 may be solely formed after removing the first gate dielectric layer on the bottom of the second trench 110b, the requirement of the thickness of the interface layer and the quality of the HKMG structure may be guaranteed. That is, the different thickness requirements for the gate dielectric layer of the I/O devices and the HKMG structured core devices are matched simultaneously, thus the integration of the fabrication process of the I/O devices and the HKMG process of the core devices is achieved.

Because a high temperature (higher than 500° C.) may affect the quality of the high-K dielectric layer 113 and the metal gates 114, it may be unable to perform the high temperature process, such as the annealing process for forming the sources 107a and the drains 107b after forming the high-K dielectric layer 113. Therefore, in the disclosed embodiments, the fabrication process of the I/O devices and the gate-last process is combined, which may not only ensure the quality of the high-K dielectric layer 113 and metal gates 114, but also integrate the fabrication process of the I/O devices and the HKMG process of the core devices.

In another embodiment, an integrated semiconductor device may be formed by the above disclosed processes and methods; the corresponding integrated semiconductor device is illustrated in FIG. 8.

The integrated semiconductor device includes the semiconductor substrate 100 having the isolation regions 101, the first active region 102a and the second active region 102b. The first active region 102a is the active region of the I/O devices and the second active region 102b is the active region of the HKMG structured devices (core devices). Further, the semiconductor device includes a plurality of sources 107a and drains 107b in both the I/O device region and the core device region.

The integrated semiconductor device also includes the first gate dielectric layer 103 on the surface of the first active region 102a, and the second gate dielectric layer 112 on the second active region 102b. Further, the semiconductor device includes HKMG structured gates consisting of the high-K dielectric layer 113 on the second gate dielectric layer 112 and the metal gates 114 on the high-K dielectric layer 113. And further, the semiconductor device includes the second barrier layer 108 covering the surface of the semiconductor substrate 100 except the portion in the HKMG structured gate region, and the interlayer dielectric layer 109 covering the second barrier layer 108. The surface of the interlayer dielectric layer 109 is leveled with the top surface of the metal gates 114. The detailed structures and intermediate structures are described above with respect to the fabrication methods.

It should be understood that the specification is described by exemplary embodiments, but it is not necessary that each embodiment includes an independent technical solution. Those skilled in the art can understand the specification as whole and technical features in the various embodiments can be combined to other embodiments understandable to other persons of ordinary skill in the art.

The above detailed descriptions only illustrate certain exemplary embodiments of the present invention, and are not intended to limit the scope of the present invention. Any equivalent or modification thereof, without departing the sprint and principle of the present invention, falls within the true scope of the present invention.

What is claimed is:

1. A method for fabricating an integrated semiconductor structure, comprising:
providing a semiconductor substrate;
forming a first active region, a second active region and a plurality of isolation region in the semiconductor substrate;
forming a first gate dielectric layer on one surface of the semiconductor substrate;
forming an interlayer dielectric layer leveling with a substituted gate electrode layer on the semiconductor substrate;
removing the substituted gate electrode layer to form a first trench on the first active region and a second trench on the second active region using the interlayer dielectric layer as a mask;
removing the first gate dielectric layer in the second trench and reserving the first gate dielectric layer in the first trench using a first barrier layer on the first trench as a mask;
forming a second gate dielectric layer having a thickness smaller than the thickness of the first gate dielectric layer on the bottom of the second trench; and
forming metal gates in the first trench and the second trench.

2. The method according to claim 1, wherein:
the first active region is an active region of I/O devices and the second active region is an active region of (high-k/metal gate) HKMG structured devices (core devices).

3. The method according to claim 1, wherein:
the thickness of the first gate dielectric layer is in a range of 1 nm~6 nm and the thickness of the second gate dielectric layer is a range of 0.1 nm~1 nm.

4. The method according to claim 1, wherein:
the first gate dielectric layer on the semiconductor substrate is formed by a thermal oxidation process before forming a poly silicon layer of the substituted gate electrode layer and the second gate dielectric layer (interface layer) on the semiconductor substrate is formed a chemical oxidation process.

5. The method according to claim 4, wherein after forming the substituted gate electrode layer by further including:
forming sources and drains in the semiconductor substrate using the substituted gate electrode layer as a mask.

6. The method according to claim 1, before forming the second gate dielectric layer, further including:
removing the first barrier layer; and
cleaning the semiconductor substrate subsequently using a chemical cleaning process.

7. The method according to claim 1, before forming the interlayer dielectric layer, further including:
forming a second barrier layer made of silicon nitride on the semiconductor substrate.

8. The method according to claim 1, wherein the forming the metal gate layer by filling the first trench and the second trench further includes:
forming a high-K dielectric layers on the bottoms and sidewalls of the first trench and the second trench;
forming a gate metal layer on the surface of the high-K dielectric layer by completely filling the first trench and the second trench; and
forming metal gates by removing the portion of the gate metal layer and the high-K layer on the surface of the interlayer dielectric layer and making the interlayer dielectric layer leveled with the top of the metal gates.

9. The method according to claim 8, wherein:
the high-K dielectric layer is made of at least one of hafnium dioxide, hafnium silicate, lanthanum oxide, lanthanum aluminum oxide, zirconium oxide, zirconium silicate, tantalum oxide, titanium oxide, barium strontium titanate, barium titanate, strontium titanate, yttrium oxide, lead scandium tantalite and lead zinc niobate.

10. The method according to claim 8, wherein; the gate metal layer is a single coating or a multiple-stacked layer.

11. The method according to claim 10, wherein: the single coating gate metal layer is made of any one of aluminum, copper, silver, gold, platinum, nickel, titanium, thallium, tantalum, tungsten, tungsten silicide, titanium tungsten alloy, titanium nitride, thallium nitride, thallium carbide, nickel platinum ally and thallium nitrate silicate.

12. The method according to claim 10, wherein the multiple-stacked gate metal layer comprises:
a work function layer on the second gate dielectric layer; and
a second gate metal layer on the work function layer.

13. The method according claim to 12, wherein: the work function layer is made of any one of titanium, thallium, titanium aluminum alloy and thallium nitride.

14. The method according claim to 12, wherein: the second gate metal layer is made of any one of aluminum, copper, silver, gold, platinum, nickel, titanium, thallium, tantalum, tungsten, tungsten silicide, titanium tungsten alloy, titanium nitride, thallium nitride, thallium carbide, nickel platinum alloy and thallium nitrate silicate.

15. The method according to claim 1, further including: performing subsequent CMOS processes.

* * * * *